United States Patent [19]

Nakamura et al.

[11] Patent Number: 5,300,799
[45] Date of Patent: Apr. 5, 1994

[54] NONVOLATILE SEMICONDUCTOR STORAGE DEVICE WITH FERROELECTRIC CAPACITORS

[75] Inventors: Takashi Nakamura; Hironobu Nakao, both of Kyoto, Japan

[73] Assignee: Rohm Co., Ltd., Kyoto, Japan

[21] Appl. No.: 973,078

[22] Filed: Nov. 6, 1992

[30] Foreign Application Priority Data

Nov. 8, 1991 [JP] Japan .................. 3-321046

[51] Int. Cl.[5] ................................. H01L 29/78
[52] U.S. Cl. ........................... 257/295; 257/300; 257/390; 257/324; 365/145
[58] Field of Search ............ 257/300, 316, 390, 391, 257/295, 324, 314; 365/145

[56] References Cited

U.S. PATENT DOCUMENTS 5,146,299 9/1992 Lampe et al. .................. 257/314
5,155,573 10/1992 Abe et al. ...................... 257/304

FOREIGN PATENT DOCUMENTS 0469934 2/1992 European Pat. Off. .......... 365/145

Primary Examiner—William Mintel
Attorney, Agent, or Firm—Brumbaugh, Graves, Donohue & Raymond

[57] ABSTRACT

In an element forming region isolated from other regions by a field oxide, one select transistor and a plurality of MOS transistors are connected in series so that a source/drain diffusion region is commonly owned by two neighboring transistors. The gate electrodes of the MOS transistors are connected to the lower electrodes of ferroelectric capacitors, respectively. The gate electrode of the select transistor, and the lower electrodes and upper electrodes of the ferroelectric capacitors are led out as word lines. A metal wiring which serves as a bit line is connected to a drain diffusion region.

2 Claims, 3 Drawing Sheets

NONVOLATILE SEMICONDUCTOR STORAGE DEVICE WITH FERROELECTRIC CAPACITORS

BACKGROUND OF THE INVENTION

This invention relates to a nonvolatile semiconductor storage device such as an EEPROM (Electrically Erasable and Programmable ROM), and more particularly to a device for storing information using a residual dielectric polarization of a ferroelectric substance.

As a conventional nonvolatile semiconductor storage device of this kind, known are devices such as shown in FIGS. 5 and 6.

The nonvolatile semiconductor storage device shown in FIG. 5 comprises memory cells each of which consists of one memory transistor MTr and two select transistors STr1 and STr2. The memory transistor MTr is a field-effect transistor having a gate structure in which a metal film, a ferroelectric substance film and a semiconductor film are laminated from the top in this sequence.

Hereinafter, the operations of writing, erasing and reading data for a memory cell C1 will be briefly described.

When a data is to be written into the cell, word lines $WL1_1$ and $WL1_2$ are grounded and a positive voltage (e.g., 5 V) is applied to a word line $WL1_3$. Under this state, a positive high voltage (e.g., 10 V) is applied to a bit line BL1, so that the ferroelectric substance film of the memory transistor MTr is affected by an electric field through the select transistor STr2 of the memory cell C1, whereby the ferroelectric substance film is polarized. This causes the memory transistor MTr which is an N-channel transistor, to become a nonconductive state. This state is defined as the write state in which data "1" is written in the memory cell.

When the written data is to be erased, the word lines $WL1_1$ and $WL1_3$ and the bit line BL1 are grounded and a positive high voltage is applied to the word line $WL1_2$. This causes the ferroelectric substance film of the memory transistor MTr of the memory cell C1 to be affected by an electric field which is opposite in direction to that in the writing process, so that the ferroelectric substance film is polarized to the reverse polarity. As a result, the N-channel memory transistor MTr becomes a conductive state (namely, the state in which data "0" is stored).

When a data is to be read, a positive voltage is applied to the word lines $WL1_1$ and $WL1_3$ and the word line $WL1_2$ is grounded. A sense amplifier SA connected to the bit line BL1 detects the flow of a current. When no current flow is detected, it means the reading of data "1", and, when a current flow is detected, it means the reading of data "0".

In contrast, the nonvolatile semiconductor storage device shown in FIG. 6 comprises memory cells each of which consists of one select transistor STr and one ferroelectric capacitor FC.

The process of writing a data into a memory cell C1 is performed by applying a positive voltage to a word line WL1 and a positive high voltage to a bit line BL1, thereby making the ferroelectric capacitor FC a certain polarization state.

The data erasing process is performed by applying a positive voltage to the word line WL1 and a negative high voltage to the bit line BL1, thereby polarizing the ferroelectric capacitor FC to the reverse polarity.

In the data reading process, a positive voltage is applied to the word line WL1 and a positive voltage is applied to the bit line BL1, and the contents of the written data, i.e., "1" or "0" is judged depending on the level of a current detected by a sense amplifier SA which is connected to the bit line BL1.

The thus configured prior art examples have the following problems.

The nonvolatile semiconductor storage device shown in FIG. 5 has a problem in that the configuration where one memory cell consists of one memory transistor and two select transistors causes the cell size to become large, and therefore this configuration is not adequate for a high integration.

The nonvolatile semiconductor storage device shown in FIG. 6 has a configuration which may be subjected to an integration of a certain degree. In such a storage device, however, a so-called destructive readout in which the polarization state of the ferroelectric capacitor is changed by a current flowing into the capacitor during the data reading process is conducted, so that the refresh operation is required to be performed for retaining the written data. As a result, there arises a problem in that the periphery circuitry has a complex configuration.

SUMMARY OF THE INVENTION

The invention has been conducted in view of the above-mentioned circumstances, and has an object of providing a nonvolatile semiconductor storage device which can be highly integrated and in which the refresh operation is not required to be performed during the data reading process.

In order to accomplish this object, the device of the invention has the following configuration.

According to the invention, in a nonvolatile semiconductor storage device which stores information using a residual dielectric polarization of a ferroelectric substance, a memory cell is formed in one element region which is isolated from other regions by an insulating film, the memory cell comprising: at least one select transistor; a plurality of MOS transistors which are connected in series with the select transistor, two neighboring transistors of the MOS transistors sharing a diffusion region; and a plurality of ferroelectric capacitors which are arranged correspondingly to the MOS transistors and each of which has one electrode equivalently connected to a gate electrode of the respective MOS transistor, the gate electrode of the select transistor is led out as a first word line, the junctions of the gate electrodes of the MOS transistors and the electrodes of the respective ferroelectric capacitors are led out as second word lines;

the other electrodes of said ferroelectric capacitors are led out as third word lines, and a bit line is connected to the diffusion region of the select transistor or the end MOS transistor.

The device of the invention functions in the following manner.

The initialization of memory cells and the data erasure process are performed by applying a voltage of a predetermined level to all of the third word lines to make uniform the polarization polarities of all the ferroelectric capacitors.

In the data writing process, a voltage of a predetermined level is applied to the bit line of a memory cell into which the data is to be written, thereby selecting this memory cell. A voltage of a predetermined level is applied to the second and third word lines in such a manner that the MOS transistors are sequentially affected by the voltage of the bit line in the sequence beginning from the MOS transistor which is farther from the bit line (or the inner bit), whereby the polarity of the ferroelectric capacitor of the selected bit is inverted.

When a data is to be read, a read circuit is connected to the bit line of the memory cell from which the data is to be read, and a voltage of a predetermined level is applied to the first word line to make the select transistor conductive. Then, a voltage of a predetermined level is applied to the second and third word lines to make conductive the MOS transistors of the bits other than the selected bit, and it is detected whether or not a current flows through this bit line, thereby reading the data of the selected bit.

DETAILED DESCRIPTION OF THE INVENTION

Hereinafter, an embodiment of the invention will be described with reference to the accompanying drawings.

Figure 1:
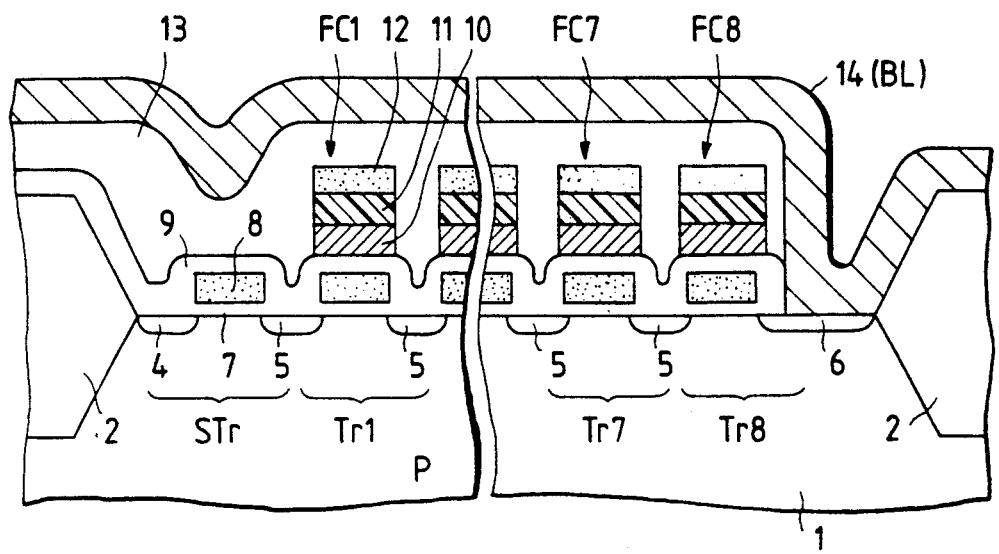
FIG. 1 is a sectional view (a sectional view taken in the direction of arrows A in FIG. 2) showing the device configuration of a nonvolatile semiconductor storage device which is an embodiment of the invention.
Figure 2:
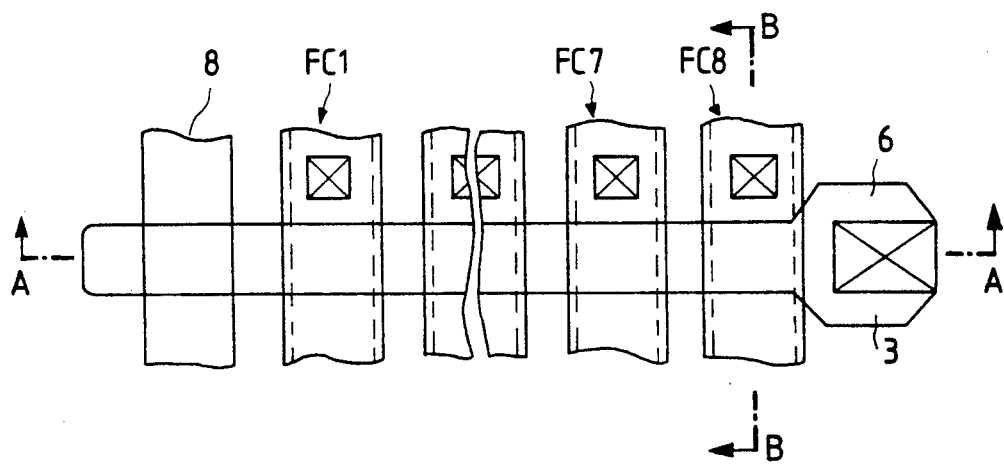
FIG. 2 is a plan view of the device of the embodiment.
Figure 3:
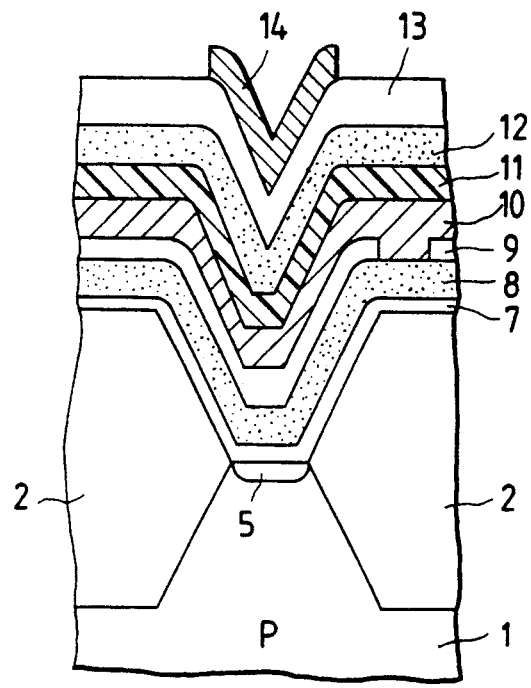
FIG. 3 is a sectional view taken in the direction of arrows B in FIG. 2.
Figure 4:
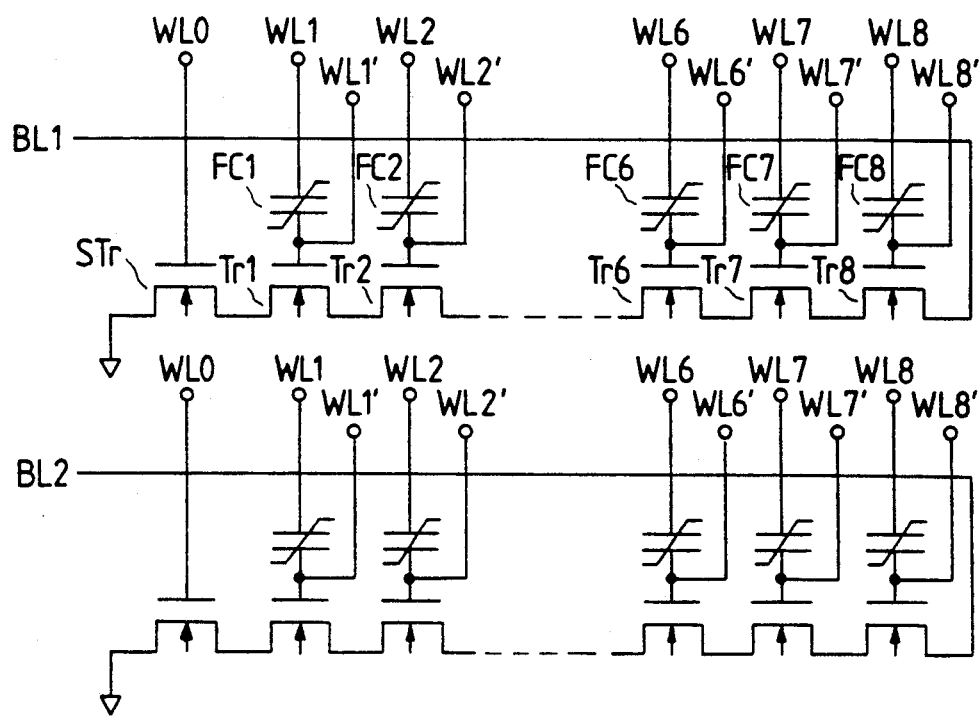
FIG. 4 is a diagram showing an equivalent circuit of the device of the embodiment.
Figure 5:
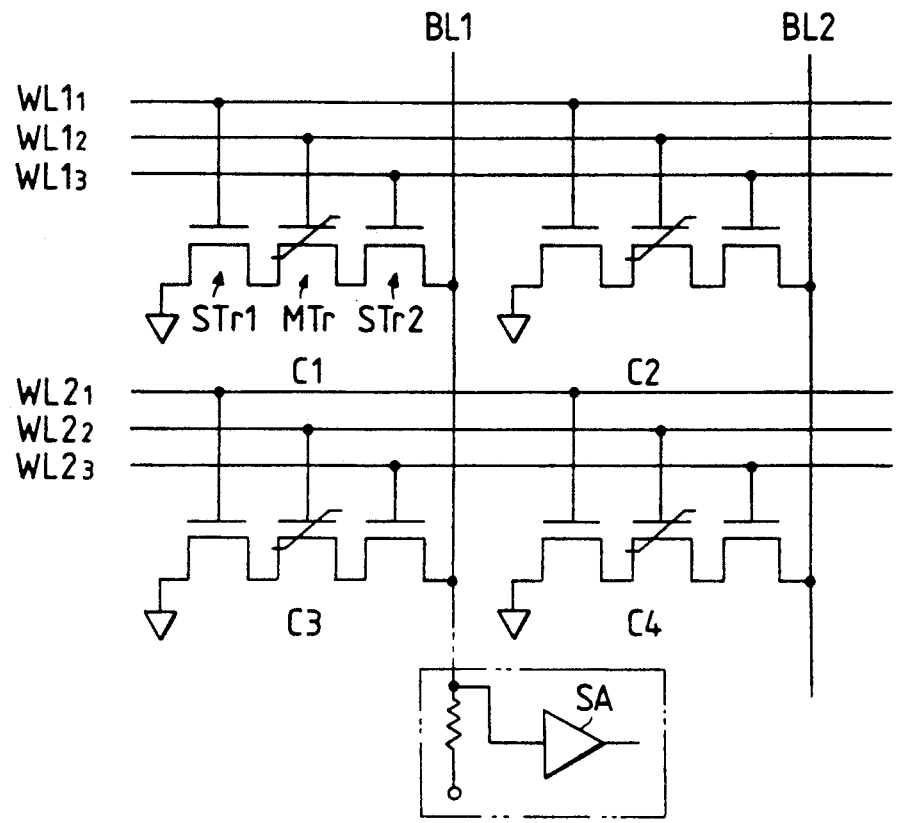
FIG. 5 is a diagram showing an equivalent circuit of an example of a conventional nonvolatile semiconductor storage device.
Figure 6:
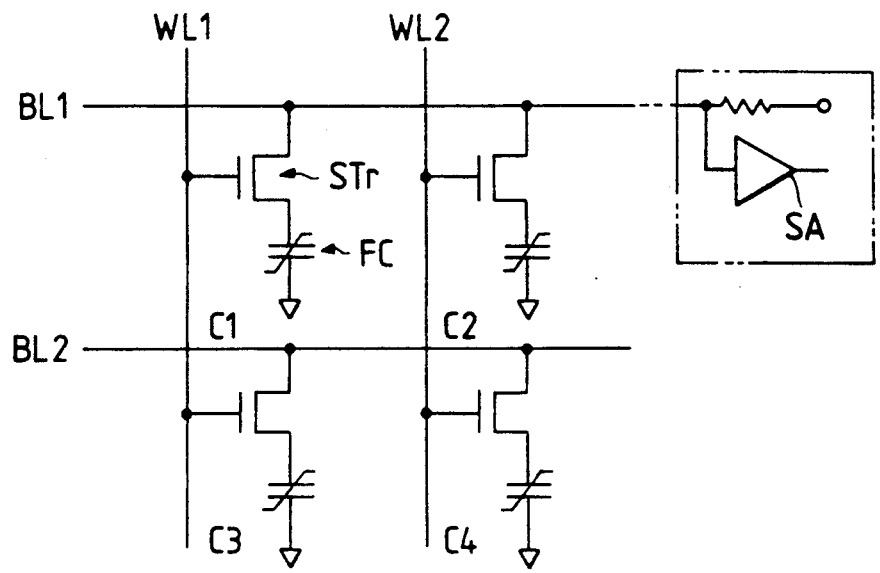
FIG. 6 is a diagram showing an equivalent circuit of another example of a conventional nonvolatile semiconductor storage device.

FIG. 1 is a sectional view (a sectional view taken in the direction of arrows A in FIG. 2) showing the device configuration of a nonvolatile semiconductor storage device which is an embodiment of the invention, FIG. 2 is a plan view of the embodiment, FIG. 3 is a sectional view taken in the direction of arrows B in FIG. 2, and FIG. 4 is a diagram showing an equivalent circuit.

As shown in FIG. 4, the nonvolatile semiconductor storage device has memory cells of the NAND type structure each of which consists of 8 bits. Each memory cell comprises one select transistor STr, eight MOS transistors Tr (respectively labeled by Tr1-Tr8 beginning with that nearest to the select transistor STr), and ferroelectric capacitors FC (respectively labeled by FC1-FC8 beginning with that nearest to the select transistor STr) which are connected to the gate electrodes of the respective MOS transistors.

Referring now to FIGS. 1 to 3, the cell structure will be described. In the figures, reference 1 designates a P-type silicon substrate on which an element forming region is isolated from other regions by a field oxide 2. In FIG. 2, reference 3 designates the element forming region. Reference 4 designates a source diffusion region, 5 designates source/drain diffusion regions which serve for both of a source and a drain, and 6 designates a drain diffusion region. Gate electrodes 8 are formed through a gate oxide 7 on regions which are respectively positioned between the diffusion regions 4, 5 and 6. The gate electrodes 8 are covered by a layer insulation film 9.

On the MOS transistors Tr1–Tr8, formed are the ferroelectric capacitors FC1–FC8, each having a laminated structure in which a lower electrode 10, a ferroelectric substance film 11 and an upper electrode 12 are laminated in this sequence. The ferroelectric capacitors FC are covered by a layer insulation film 13 on which a metal wiring 14 is formed. The metal wiring 14 is connected to the drain diffusion region 6 and constitutes the bit line BL (indicated by BL1, BL2, ... in FIG. 4).

The gate electrode 8 of the select transistor STr is led out to the outside to serve as the word line WL0 (the first word line in the invention). The upper electrodes 12 of the ferroelectric capacitors FC constitute the word lines WL1–WL8 (the third word lines in the invention), respectively, and the lower electrodes 10 of the ferroelectric capacitors FC are connected to the gate electrodes 8 of the MOS transistors Tr1–Tr8 as shown in FIG. 3 to constitute the word lines WL1'–WL8' (the second word lines in the invention), respectively.

Next, the method of producing the above-mentioned nonvolatile semiconductor storage device will be described.

At first, the field oxide 2 is formed on the silicon substrate 1 using the LOCOS (Local Oxidation of Silicon) technique, thereby isolating the element forming region 3 from other regions. The gate oxide 7 is formed on the element forming region 3 by the thermal oxidation, and a polysilicon film is deposited thereon using the CVD (Chemical Vapor Deposition) technique. The polysilicon film is doped with phosphorus or the like to be provided with conductivity, and then patterned by anisotropic etching so as to form the gate electrodes 8 of the select transistor STr and MOS transistors Tr. In addition to polysilicon, substances useful as the material of the gate electrodes 8 include a conductive substance such as a metal and silicide which is a compound of silicon and a refractory metal such as tungsten (W) and molybdenum (Mo).

Arsenic or the like is ion-implanted into the silicon substrate 1 using the patterned gate electrodes 8 as a mask, to form in a self-aligned manner N+ impurity region: the source diffusion region 4; the source/drain diffusion regions 5; and the drain diffusion region 6.

Thereafter, the layer insulation film 9 is deposited on the gate electrodes 8 using the CVD technique. As a material of the layer insulation film 9, for example, a silicon oxide film to which phosphorus is added (PSG), or PSG to which boron is added (BPSG) may be used.

A conductive film which will function as the lower electrodes 10 is formed on the layer insulation film 9. In this case, contact holes are previously formed at desired portions (as shown in FIG. 3, over the field oxide 2) of the layer insulation film 9, so that the conductive film is electrically connected to the gate electrodes 8. The conductive film is formed by depositing platinum (Pt) in the thickness of about 100 to 300 nm using the sputtering process, so that the material of the ferroelectric substance film 11, e.g., lead titanate and zirconate (PZT) exhibits excellent crystal orientation.

A ferroelectric substance is deposited on the conductive film. An example of the ferroelectric substance other than PZT mentioned above is $(Pb_xLa_{1-x})(Zr_yTi_{1-y})O_3$, called PLZT. A ferroelectric substance of this kind is deposited in the form of a film of the thickness of about 300 nm by the sol-gel method using a spin coater, the MOD (Metal Organic Decomposition) method, the sputtering method, the MOCVD (Metal Organic Chemical Vapor Deposition) method, the laser abrasion method, or the like.

A further conductive film which will function as the upper electrodes 12 is deposited on the ferroelectric substance. A metal (e.g., platinum), a polysilicon film into which phosphorus or the like is doped, silicide, etc. may be used as the material of the further conductive film.

After the conductive film, the ferroelectric substance and the further conductive film are deposited on the layer insulation film 9 in this sequence, a patterning process is conducted using the photoetching technique to form the ferroelectric capacitors FC1-FC8 each consisting of the lower electrode 10, the ferroelectric substance film 11 and the upper electrode 12. Preferably, the ion milling method and the reactive ion etching (RIE) method which are excellent in processability for a fine structure may be used in the patterning process.

Thereafter, the thus formed ferroelectric capacitors FC are covered by the layer insulation film 13 such as PSG or BPSG. After a contact hole is formed at a portion of the layer insulation film 13 above the drain diffusion region 6, a conductive layer of Al-Si or the like is deposited by the sputtering method, and then patterned using the photoetching technique to form the metal wiring 14.

Next, the operations of writing, erasing and reading data in the nonvolatile semiconductor storage device of the embodiment will be described.

In the following description, an example in which data "10010000" is written into the memory cell at the uppermost column and connected to the bit line BL1 will be described.

Firstly, in order to initialize the ferroelectric capacitors FC1-FC8 of all the memory cells, or to make all the capacitors the state of "0", a positive high voltage (e.g., 15 V) is applied to the word lines WL1-WL8, and the word lines WL1'-WL8' are opened or floated, whereby the ferroelectric capacitors FC1-FC8 are uniformly changed to a certain polarization state. The silicon substrate 1 is kept grounded during all the initializing, writing, erasing and reading processes.

Then, a positive high voltage is applied to the bit line BL1, and the other bit lines BL2, . . . are grounded, so that the memory cell at the uppermost column is selected. The word line WL1 is grounded, the word line WL1' is opened, and the potentials of all the other word lines WL2-WL8 and WL2'-WL8' are set to a positive voltage (e.g., 5 V). This causes the MOS transistors Tr2-Tr8 of the memory cell at the uppermost column to be conductive, and therefore the positive high voltage applied through the bit line BL1 affects the MOS transistor Tr1. As a result, the ferroelectric capacitor FC1 is affected by an electric field which is opposite in direction to that in the initial state, so that the ferroelectric capacitor FC1 is polarized to the reversed polarity, or data "1" is written into the ferroelectric capacitor FC1. At this time, the potentials of the both terminals of each of the other ferroelectric capacitors FC2-FC8 are kept to be equal to each other (i.e., at 5 V). Therefore, the polarization state of these capacitors remains at its initial state. The operations described above causes data "10000000" to be written into the memory cell at the uppermost column.

When the above-described first stage of the writing process is completed, the writing process enters the second stage. More specifically, a positive high voltage is applied to the bit line BL1, and the other bit lines BL2, . . . are grounded. In order to make the MOS transistor Tr3 of the third bit nonconductive, a negative voltage (e.g., −5 V) is applied to the word lines WL3 and WL3'. The word line WL4 is grounded, and the word line WL4' is opened. A positive voltage is applied to the word lines WL5-WL8 and WL5'-WL8', so that the MOS transistors Tr5-Tr8 are conductive, thereby allowing the positive high voltage applied through the bit line BL1 to affect the MOS transistor Tr4. As a result, the ferroelectric capacitor FC4 is affected by an electric field which is opposite in direction to that in the initial state, so that the ferroelectric capacitor FC4 is polarized to the reversed polarity, or data "1" is written into the ferroelectric capacitor FC4. At this time, the other ferroelectric capacitors FC1-FC3 and FC5-FC8 remain at their initial polarization state.

As a result of the above-described first and second stages of the writing process, data "10010000" is written into the memory cell at the uppermost column. In this way, in the writing process, the operation of writing data is performed in the sequence beginning with the bit farther from the bit line BL (inner bit). When data "10010010" is to be written, therefore, the writing operation is conducted three times.

The data erasing process is performed by the above-mentioned initializing operation so that all bits are returned to "0" in block.

The data reading process is performed in the following manner. When the data of the fourth bit of the memory cell at the uppermost column is to be read, for example, a not-illustrated read circuit (sense amplifier) is connected to the bit line BL1 and not connected to the other bit lines BL2, . . . Under this condition, the word line WL4 is grounded, and the word line WL4' is opened, while the potentials of all the other word lines are set to a positive voltage. As a result, the MOS transistor Tr4 of the fourth bit becomes conductive or nonconductive depending on the polarization state of the ferroelectric capacitor FC4 of the fourth bit, and all the other transistors including the select transistor STr become nonconductive. Hence, the polarization state (i.e., data) of the ferroelectric capacitor FC4 can be read by detecting the current flowing through the bit line BL1. In the memory cell, data is read on the basis of the conductive or nonconductive state of the MOS transistor Tr of the selected bit, and therefore the so-called nondestructive readout in which the polarization state of the ferroelectric capacitor is not changed during the data reading process is performed.

As described above, in the nonvolatile semiconductor storage device of the embodiment, the MOS transistors are connected in series in the unit of one byte, and two neighboring MOS transistors share the source/drain diffusion region. Accordingly, the area for forming diffusion regions can be reduced in size by half.

Moreover, the separation between elements by the field oxide 2 is conducted in the unit of one byte, whereas this separation is conducted in the unit of one bit in a prior art storage device. According to the embodiment, consequently, the area for forming the field oxide 2 is greatly reduced in size.

Furthermore, in a prior art storage device, the connection between the metal wiring (bit line) 14 and the silicon substrate (in the illustrated embodiment, the drain diffusion region 6) must be conducted for each bit. In contrast, according to the embodiment, this connection is conducted at one-portion for each byte, with the result that the area required for the connection can be reduced in accordance with the reduced number of contact holes.

As seen from FIG. 3, the connection between the lower electrode 10 of each ferroelectric capacitor and the respective gate electrode 8 can be formed with a small step difference and on the field oxide 2, thereby preventing the increase of the cell area owing to the formation of this connection from occurring.

The embodiment in which one memory cell consists of eight MOS transistors has been described. The invention is not restricted to such a configuration, and is also applicable to any configuration wherein one memory cell consists of a plurality of MOS transistors. The number of MOS transistors constituting a memory cell can be arbitrarily selected.

In the embodiment, eight MOS transistors are connected to a bit line, and the select transistor STr is located at the position most distant from the bit line, Alternatively, a bit line may be connected to a select transistor STr to which MOS transistors are connected in series, or a select transistor STr is disposed at the both ends of a series circuit of MOS transistors.

Although the embodiment in which a memory cell consists of N-channel MOS transistors has been described, it is obvious for those skilled in the art that the invention is also applicable to a device in which a memory cell consists of P-channel MOS transistors.

In the illustrated embodiment, the gate electrode of a MOS transistor and the lower electrode of a ferroelectric capacitor are individually formed and then connected to each other to constitute a word line. The invention is not restricted to this configuration, and can be applied also to a configuration wherein the gate electrode of a MOS transistor functions also as the lower electrode of a ferroelectric capacitor. In the invention, the configuration in which one electrode of a ferroelectric capacitor is equivalently connected to the gate electrode of the respective MOS transistor includes such a case wherein a single electrode serves as these two electrodes.

As apparent from the above description, according to the invention, at least one select transistor, a plurality of MOS transistors, and a plurality of ferroelectric capacitors which are respectively connected to the gate electrodes of the MOS transistors are formed in one element region isolated from other regions by an insulating film, and the select transistor and the plurality of MOS transistors are connected in series in such a manner that two neighboring transistors share a diffusion region. Therefore, the areas for element isolating regions and regions for connecting bits can be reduced in size, thereby enabling a nonvolatile semiconductor storage device of a high integration to be realized. Since the configuration of the invention does not cause the polarization state of a ferroelectric capacitor to be changed during the data reading process, it is not necessary to perform the refresh operation for retaining data, and therefore the configuration of the peripheral circuitry can be simplified.

What is claimed is:

1. A nonvolatile semiconductor storage device which stores information using a residual dielectric polarization of a ferroelectric substance and comprises at least one memory cell, wherein said memory cell is formed in one element region which is isolated from other regions by an insulating film, said memory cell comprising: at least one select transistor; a plurality of transistors which are connected in series with said select transistor, two neighboring transistors of said plurality of transistors sharing a diffusion region; and a plurality of ferroelectric capacitors which are arranged correspondingly to said plurality of transistors and each of which has one electrode equivalently connected to a gate electrode of each of said plurality of transistors, the gate electrode of said select transistor is led out as a first word line, a junction between said gate electrode of each of said plurality of transistors and said one electrode of each of said ferroelectric capacitors is led out as a second word line;

another electrode of each of said ferroelectric capacitors is led out as a third word line, and a bit line is connected to one of said diffusion region of said select transistor and the end one of said plurality of transistors.

2. A nonvolatile semiconductor storage device as claimed in claim 1, wherein said one electrode of each of said ferroelectric capacitors is the same as said gate electrode of each of said plurality of transistors.

* * * * *